(12) United States Patent
Cai

(10) Patent No.: US 12,175,868 B2
(45) Date of Patent: Dec. 24, 2024

(54) VEHICLE CONTROL DEVICE AND VEHICLE CONTROL SYSTEM

(71) Applicant: VOLKSWAGEN AKTIENGESELLSCHAFT, Wolfsburg (DE)

(72) Inventor: Jiyong Cai, Beijing (CN)

(73) Assignee: VOLKSWAGEN AKTIENGESELLSCHAFT, Wolfsburg (DE)

( * ) Notice: Subject to any disclaimer, the term of this patent is extended or adjusted under 35 U.S.C. 154(b) by 0 days.

(21) Appl. No.: 17/607,596

(22) PCT Filed: Apr. 29, 2019

(86) PCT No.: PCT/CN2019/085056
§ 371 (c)(1),
(2) Date: Oct. 29, 2021

(87) PCT Pub. No.: WO2020/220222
PCT Pub. Date: Nov. 5, 2020

(65) Prior Publication Data
US 2024/0135813 A1   Apr. 25, 2024
US 2024/0233532 A9   Jul. 11, 2024

(51) Int. Cl.
*G08G 1/0967* (2006.01)
*G06F 30/15* (2020.01)
(Continued)

(52) U.S. Cl.
CPC ....... *G08G 1/096725* (2013.01); *G06F 30/15* (2020.01); *G08G 1/0125* (2013.01); *G08G 1/096775* (2013.01); *G08G 1/164* (2013.01)

(58) Field of Classification Search
CPC .......... G08G 1/096725; G08G 1/0125; G08G 1/096775; G08G 1/164; G06F 30/15
See application file for complete search history.

(56) References Cited

U.S. PATENT DOCUMENTS 10,518,769 B2    12/2019  Sen et al.
2009/0228172 A1   9/2009  Markyvech et al.
(Continued)

FOREIGN PATENT DOCUMENTS

CN    101526615 A    9/2009
CN    102768798 A    11/2012
(Continued)

OTHER PUBLICATIONS

Search Report for European Patent Application No. 19 926 896.2, dated Dec. 11, 2022.
(Continued)

*Primary Examiner* — Justin Holmes
(74) *Attorney, Agent, or Firm* — PEARL COHEN ZEDEK LATZER BARATZ LLP

(57) ABSTRACT

There is disclosed a vehicle control device and method, wherein a vehicle and other vehicles within a certain range around the present vehicle exchange one of respective vehicle dimension information and vehicle model information as well as vehicle motion information, and the vehicle controls a motion of the vehicle according to information of the vehicle and information of other vehicles received. There is also disclosed a vehicle control system and method, wherein each vehicle transmits one of its respective vehicle dimension information and vehicle model information as well as vehicle motion information to a server, wherein the server calculates a travel scheme for each vehicle according to the information received.

15 Claims, 4 Drawing Sheets

(51) Int. Cl.
  *G08G 1/01* (2006.01)
  *G08G 1/16* (2006.01)

(56) References Cited

U.S. PATENT DOCUMENTS

| | | |
|---|---|---|
| 2013/0253815 A1 | 9/2013 | Orfila et al. |
| 2014/0201266 A1 | 7/2014 | Jackson et al. |
| 2016/0171015 A1 | 6/2016 | Karlsson |
| 2016/0297430 A1 | 10/2016 | Jones et al. |
| 2016/0357262 A1 | 12/2016 | Ansari |
| 2017/0323505 A1 | 11/2017 | Gaddam et al. |
| 2017/0334441 A1 | 11/2017 | Sen et al. |
| 2018/0089907 A1 | 3/2018 | Maruoka et al. |
| 2018/0253095 A1* | 9/2018 | Ryan ............ G06N 5/01 |
| 2019/0071075 A1 | 3/2019 | Mimura |
| 2019/0384303 A1* | 12/2019 | Muller ............ G06N 20/00 |

FOREIGN PATENT DOCUMENTS

| | | | |
|---|---|---|---|
| CN | 103456169 A | | 12/2013 |
| CN | 104882025 A | | 9/2015 |
| CN | 205203002 U | | 5/2016 |
| CN | 105702027 A | * | 6/2016 ......... G06F 16/5838 |
| CN | 205292626 U | | 6/2016 |
| CN | 106781691 A | | 5/2017 |
| CN | 107444401 A | | 12/2017 |
| CN | 107818377 A | | 3/2018 |
| CN | 108202669 A | | 6/2018 |
| CN | 108528458 A | | 9/2018 |
| CN | 108538069 A | | 9/2018 |
| CN | 108877234 A | | 11/2018 |
| CN | 208069797 U | | 11/2018 |
| CN | 108932872 A | | 12/2018 |
| CN | 109074740 A | | 12/2018 |
| CN | 113256993 A | * | 8/2021 |
| DE | 102016111079 A1 | | 12/2017 |
| EP | 2 642 464 A1 | | 9/2013 |
| EP | 3 035 315 A1 | | 6/2016 |
| GB | 2547997 A | | 9/2017 |
| JP | 2007316685 A | | 12/2007 |
| JP | 2015-161966 A | | 9/2015 |
| JP | 2017191551 A | | 10/2017 |

OTHER PUBLICATIONS

International Search Report of PCT Application No. PCT/CN2019/085056, mailed Jan. 17, 2020.

* cited by examiner

VEHICLE CONTROL DEVICE AND VEHICLE CONTROL SYSTEM

CROSS-REFERENCE TO RELATED APPLICATIONS

This application is a National Phase Application of PCT International Application No. PCT/CN2019/085056, International Filing Date Apr. 29, 2019, which is hereby incorporated by reference.

TECHNICAL FIELD

The present disclosure relates to a vehicle control device, a vehicle control system, and a vehicle control method.

BACKGROUND ART

In the automatic driving process, the vehicle needs to detect the positions and trajectories of vehicles around in real time. At present, the conventional method is to detect information such as a three-dimensional contour, position and motion trajectory of vehicles around by sensors such as radar, and then synthesize momentums of the vehicle and other vehicles based on the above information. However, such manner is susceptible to the reliability of the sensor, and the system is highly complicated since there is a need to perform substantial detections, substantial data transmissions and complex synthesis calculations.

CONTENT OF THE INVENTION

In order to solve at least one of the defects in the prior art, in a first aspect of the present disclosure, there is disclosed a vehicle control device. The vehicle control device may be used for installing on a vehicle to be controlled. The vehicle control device comprises: a memory; a communication module, configured to receive data of other vehicles within a certain range around the present vehicle, wherein the data of other vehicles includes motion information of other vehicles as well as at least one of dimension information of other vehicles and vehicle model information of other vehicles; and a processor, configured to: generate digitized body models of other vehicle based on the dimension information of other vehicles or based on the vehicle model information of other vehicles; and control a motion of the present vehicle according to the digitized body models of other vehicles and the motion information of other vehicles.

In a second aspect of the present disclosure, there is disclosed a vehicle control method comprising: receiving data of other vehicles within a certain range around the present vehicle, wherein the data of other vehicles includes motion information of other vehicles as well as at least one of dimension information of other vehicles and vehicle body model information of other vehicles; generating digitized body models of other vehicle based on the dimension information of other vehicles or based on the vehicle model information of other vehicles; and controlling a motion of the present vehicle according to the digitized body models of other vehicles and the motion information of other vehicles.

The communication module may be further configured for or the vehicle control method may further comprises: proactive transmitting data of the present vehicle to said other vehicles or to a server, wherein the data of the present vehicle includes motion information of the present vehicle as well as at least one of dimension information of the present vehicle and vehicle model information of the present vehicle, and the processor may be further configured for or the vehicle control method may further comprises: loading digitized models of transport facilities; obtaining a digitized body model of the present vehicle; loading the digitized body model of the present vehicle and the digitized body models of other vehicles on the digitized models of the transport facilities; and control the motion of the present vehicle according to the digitized body model of the present vehicle and the digitized body models of other vehicles loaded on the digitized models of the transport facilities and according to the motion information of the present vehicle and the motion information of other vehicles.

In the vehicle control device of the first aspect or in the vehicle control method of the second aspect, the digitized body models include three-dimensional body models.

In the vehicle control device of the first aspect or in the vehicle control method of the second aspect, the vehicle model information includes a brand, a model name, and a model year of the vehicle.

In the vehicle control device of the first aspect or in the vehicle control method of the second aspect, the motion information includes a position, speed and direction of the vehicle.

In the vehicle control device of the first aspect or in the vehicle control method of the second aspect, the motion information includes a current travel scheme. The processor may be further configured for or the vehicle control method may further comprises: determining whether other vehicles are traveling according to their current travel schemes, and if it is determined that other vehicles are traveling according to their current travel schemes and there is no new joined vehicle within the certain range around the present vehicle, then the present vehicle is controlled to continue to travel according to the current travel scheme of the present vehicle, otherwise recalculation is made according to the digitized body model of the present vehicle and the digitized body models of other vehicles to control the motion of the present vehicle.

Wherein, determining whether other vehicles are traveling according to their current travel schemes may include: comparing real-time motion information of other vehicles with theoretical motion information obtained from the current travel schemes of other vehicles.

Wherein, determining whether other vehicles are traveling according to their current travel schemes may also include: determining whether a state change signal transmitted by other vehicles is received.

In a third aspect of the present disclosure, a vehicle comprising the vehicle control device according to the first aspect of the present disclosure is disclosed.

According to a fourth aspect of the present disclosure, there is disclosed a computer readable storage medium comprising a computer program, wherein the computer program is used for performing the method according to the second aspect of the present disclosure.

According to a fifth aspect of the present disclosure, there is disclosed a vehicle control system comprising a server, wherein the server is disposed external to the vehicle, and the server is configured to receive motion information of the vehicle as well as at least one of dimension information and vehicle model information of the vehicle transmitted by each vehicle traveling on road, and the server is further configured to: load digitized models of transport facilities; generate digitized body model of each vehicle according to the dimension information of the vehicle or according to the vehicle model information of the vehicle; load the digitized body model of each vehicle on digitized models of transport facilities; calculate a travel scheme for each vehicle starting from a current moment according to the digitized body model of each vehicle loaded on the digitized models of the transport facilities and the motion information of each vehicle; and transmit an instruction to each vehicle based on the travel scheme to control the motion of the vehicle.

According to a sixth aspect of the present disclosure, there is disclosed a vehicle control method comprising: receiving motion information of the vehicle as well as at least one of dimension information and vehicle model information of the vehicle transmitted by each vehicle traveling on road by a server disposed external to the vehicle; loading digitized models of transport facilities by the server; generating digitized body model of each vehicle according to the dimension information of the vehicle or according to the vehicle model information of the vehicle; loading the digitized body model of each vehicle on digitized models of transport facilities by the server; calculating a travel scheme for each vehicle starting from a current moment by the server according to the digitized body model of each vehicle loaded on the digitized models of the transport facilities and the motion information of each vehicle; and transmitting an instruction to each vehicle by the server based on the travel scheme to control the motion of the vehicle.

In the vehicle control system of the fifth aspect and in the vehicle control method of the sixth aspect, the travel scheme may be a scheme starting from the current moment until a moment upon exiting the road.

The vehicle control system may further comprise a vehicle control device according to the first aspect located on each vehicle. The vehicle control device comprises a memory and a communication module. The memory is configured to store dimension information of the present vehicle and/or vehicle model information of the present vehicle. The communication module is configured for or the vehicle control method of the sixth aspect comprises: transmitting motion information of the present vehicle as well as at least one of dimension information and vehicle model information of the present vehicle to the server and receiving the instruction to control the motion of the present vehicle from the server.

In the vehicle control system of the fifth aspect and in the vehicle control method of the sixth aspect, the motion information includes a position, speed, direction, and destination of the vehicle.

In the vehicle control system of the fifth aspect and in the vehicle control method of the sixth aspect, the vehicle model information includes a brand, a model name, and a model year of the vehicle.

In the vehicle control system of the fifth aspect and in the vehicle control method of the sixth aspect, the digitized body model comprises a three-dimensional digitized body model.

In the vehicle control system of the fifth aspect and in the vehicle control method of the sixth aspect, the travel scheme of each vehicle starting from the current moment is calculated with such constraint conditions that each vehicle is not subject to collision during travel and each vehicle travels at its optimum speed.

In the vehicle control system of the fifth aspect and in the vehicle control method of the sixth aspect, the server is configured to recalculate the travel scheme for each vehicle only when it is determined that there is a new calculation demand.

In the vehicle control system of the fifth aspect and in the vehicle control method of the sixth aspect, the server is configured to determine that there is a new calculation demand when receiving information transmitted by a vehicle newly entering the road or determining that there is a vehicle on the road which is not travelling according to the travel scheme.

In the vehicle control system of the fifth aspect and in the vehicle control method of the sixth aspect, the server is configured to determine whether there is a vehicle on the road which is not travelling according to the travel scheme according to a compared result of actual motion information of each vehicle received by the server and theoretical motion information obtained from the travel scheme of each vehicle.

In the vehicle control system of the fifth aspect and in the vehicle control method of the sixth aspect, the server is configured to determine that there is a vehicle on the road which is not travelling according to the travel scheme when receiving a state change signal transmitted by a vehicle on the road.

In the vehicle control system of the fifth aspect and in the vehicle control method of the sixth aspect, the server is configured to receive motion information of the vehicle as well as at least one of dimension information and model information of the vehicle transmitted by the vehicle prior to entering the road and thereby determine whether to allow the vehicle to enter the road and/or an entry policy for the vehicle.

In the vehicle control system of the fifth aspect and in the vehicle control method of the sixth aspect, the server is configured to divide the digitized models of the transport facilities into a plurality of sections or a plurality of sub-models and individually distribute a storage unit and/or a calculation unit for each sections or each sub-model.

In the vehicle control system of the fifth aspect and in the vehicle control method of the sixth aspect, the server is configured to individually call each section or sub-model, individually perform calculation for each section or sub-model, and/or individually determine whether there is a new calculation demand for each section or sub-model, by using an individual calculation unit.

In the vehicle control system of the fifth aspect and in the vehicle control method of the sixth aspect, information transferred between the vehicle and the server is encrypted by a blockchain technique.

In the vehicle control system of the fifth aspect and in the vehicle control method of the sixth aspect, one or more monitoring means disposed external to the vehicle is provided, which may be configured to monitor motion information of the vehicle and transmitting the motion information to the vehicle and/or the server.

The vehicle control system of the fifth aspect may also include a vehicle control device according to the first aspect of the present disclosure. The vehicle control method of the sixth aspect may also include a vehicle method according to the second aspect of the present disclosure. They are used to control the motion of the vehicle in case of the failure of the communication between the vehicle and the server.

In the vehicle control system of the fifth aspect and in the vehicle control method of the sixth aspect, one or more relay means may be provided, wherein the communication between the vehicle and the server is performed via the relay means, which is configured to monitor a predetermined monitoring range and receive information transmitted by the vehicle when the vehicle enters and/or is within its monitoring range.

In the vehicle control system of the fifth aspect and in the vehicle control method of the sixth aspect, the relay means is disposed at a road entrance and/or before a road entrance, wherein the relay means is configured to transmit a permitting or prohibiting instruction to a vehicle ready to enter the road.

In the vehicle control system of the fifth aspect and in the vehicle control method of the sixth aspect, a plurality of relay means are provided to be spaced from each other at a predetermined distance, wherein the server individually distributes a storage unit and/or a calculation unit for each relay means as well as its monitoring range.

In the vehicle control system of the fifth aspect and in the vehicle control method of the sixth aspect, the relay means is configured to monitor whether a new calculation demand is generated within its monitoring range, and the relay means transmits vehicle data received by the relay means to the server only when monitoring that a new calculation demand is generated within its monitoring range and/or receiving a notification that a new calculation demand is generated within monitoring ranges of other relay means within a certain range around said relay means.

In the vehicle control system of the fifth aspect and in the vehicle control method of the sixth aspect, the relay means is configured to determine that a new calculation demand is generated within a monitoring range of the relay means when detecting a signal transmitted by a vehicle newly entering the road or detecting a state change signal transmitted by a vehicle within its monitoring range.

In the vehicle control system of the fifth aspect and in the vehicle control method of the sixth aspect, the relay means is configured to assist in positioning the vehicle.

In the vehicle control system of the fifth aspect and in the vehicle control method of the sixth aspect, the relay means is configured to be integrated with a monitoring sensor, and the motion information of the vehicle is monitored by the relay means.

According to a seventh aspect of the present disclosure, there is disclosed a computer readable storage medium comprising a computer program, characterized in that the computer program is used for performing the method according to the sixth aspect of the present disclosure.

BRIEF DESCRIPTION OF THE DRAWINGS

When the following detailed descriptions are read with reference to the accompanying drawings, these and other features, aspects, and advantages of the present disclosure will become better understood. In the accompanying drawings, the same reference signs present the same parts, wherein.

EMBODIMENTS

Figure 1:
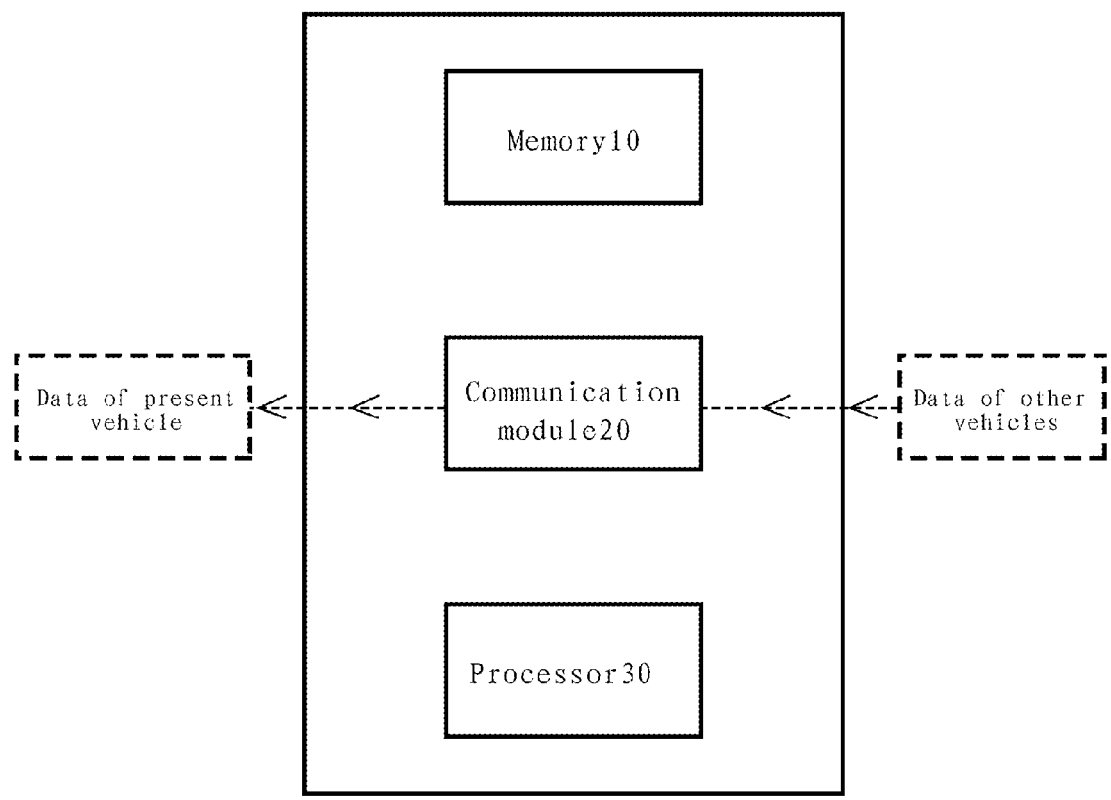
FIG. 1 shows a first embodiment according to the present disclosure.

The present disclosure will be described below with reference to the drawings, in which several embodiments of the present disclosure are shown. It should be understood, however, that the present disclosure may be presented in multiple different ways, and not limited to the embodiments described below. In fact, the embodiments described hereinafter are intended to make a more complete disclosure of the present disclosure and to adequately explain the protection scope of the present disclosure to a person skilled in the art. It should also be understood that, the embodiments disclosed herein can be combined in various ways to provide more additional embodiments.

It should be understood that, the wording in the specification is only used for describing particular embodiments and is not intended to define the present disclosure. All the terms used in the specification (including the technical terms and scientific terms), have the meanings as normally understood by a person skilled in the art, unless otherwise defined. For the sake of conciseness and/or clarity, the well-known functions or constructions may not be described in detail any longer.

The wordings "comprising", "containing", "including", "having" or the like used in the specification indicate the presence of the claimed features, but do not repel the presence of one or more other features. The wording "and/or" as used in the specification includes any and all combinations of one or more of the relevant items listed.

Any method, process, program, algorithm, or code described in the present disclosure may be converted or expressed as a programming language or a computer program. "Programming Language" and "Computer Program" are any language used to assign instructions to a computer and include (but are not limited to) these languages and their derivatives: Assembly Language, Basic, Batch File, BCPL, C, C+, C++, Delphi, Fortran, Java, JavaScript, machine code, Operating System Command Language, Pascal, Perl, PL1, scripting language, Visual Basic, meta-language specifying program itself, as well as the first generation, second generation, third generation, fourth generation and fifth generation of computer languages. They also include databases and other data patterns, as well as any other metalanguage.

The sequence of the steps in the method according to the present disclosure is not restrictive, and some steps of the method according to the present disclosure may be omitted and/or reversed without departing from the substance of the present disclosure.

In the present disclosure, in order to make an explicit description, the vehicles are respectively presented by M1, M2, . . . , Mn, where n is a natural number. The serial numbers 1, 2, . . . n of the vehicles are only for distinguishing different vehicles, but do not constitute any restriction on the sequence or positions of the vehicles.

In the following embodiments, the same members are presented by the same reference signs. In the case of not departing from the teachings of the present disclosure, unless otherwise specified, the same terms may have the same definitions, the same members and devices may have the same configurations. Moreover, for the sake of brevity, features that have been described in the previous embodiments may be omitted from describing in the following embodiments. Various features in various embodiments and implementations of the present disclosure may be used alone or in combination with other features or applied to any other embodiment and implementation alone or in combination with other features, if there is no description on the contrary and without departing from the teachings of the present disclosure.

First Embodiment

Figure 2:
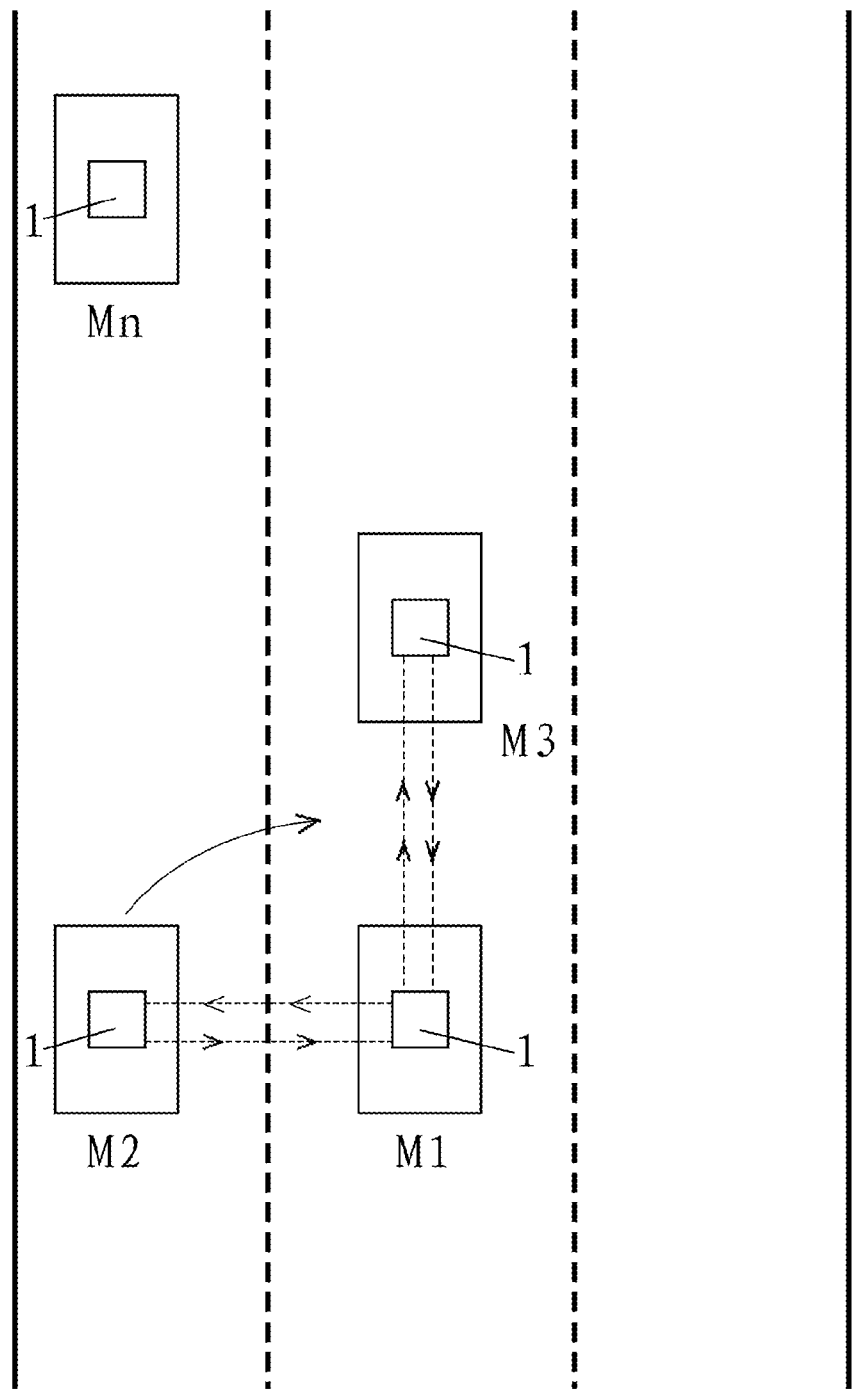
FIG. 2 shows a first embodiment according to the present disclosure.

FIGS. 1-2 show a first embodiment according to the present disclosure. Wherein, FIG. 1 shows a schematic view of a vehicle control device 1 according to a first embodiment of the present disclosure. FIG. 2 schematically shows vehicles having the vehicle control device 1 according to the first embodiment of the present disclosure traveling on a road, taking a one-way three-lane as an example.

The vehicle control device 1 according to the first embodiment of the present disclosure may be mounted on all of the vehicles M1, M2, . . . , Mn to be controlled. For convenient description, a vehicle M1 mounted with the vehicle control device 1 will be described below as an example, and the vehicle M1 is hereinafter referred to as the present vehicle. The configurations of the vehicle control device 1 in other vehicles may be the same. The vehicle control device 1 in the present vehicle may comprise a memory 10, a communication module 20, and a processor 30.

The memory 10 may include a read only memory (ROM), a random access memory (RAM), a disk storage medium, an optical storage medium, a flash memory device, or any other volatile or nonvolatile storage device. The memory 10 may be a memory on the vehicle or a memory located in a cloud.

The communication module 20 may be a wireless communication module. The wireless communication module may be a wireless transmission device that transmits and receives data based on a wireless communication protocol. The wireless communication module may be implemented in any wireless communication manner such as 2G/3G/4G/5G mobile communication, Bluetooth, infrared, Zigbee, WiFi, LPWAN, and the like. The wireless communication module may include a wireless transmitter and a wireless receiver. As an alternative, the wireless communication module may include a wireless transceiver.

The communication module may be configured to transmit data to other vehicles within a certain range around the present vehicle and to receive data from other vehicles within a certain range around the present vehicle. The range may be 5 meters to 500 meters, preferably 10 meters to 400 meters, more preferably 50 meters to 200 meters, and further preferably 100 meters. The range may also be less than 5 meters or greater than 500 meters.

The data transmitted by the communication module may include dimension information of the vehicle and motion information of the vehicle, or the data transmitted by the communication module may include a vehicle model information of the vehicle and motion information of the vehicle. The data received by the communication module may include dimension information and motion information of the vehicles that transmit the data (hereinafter referred to as other vehicles), or the data received by the communication module may include vehicle models information and motion information of other vehicles.

The dimension information of the vehicle may comprise: i) a length and width of the vehicle; ii) a length, width and height of the vehicle; or iii) a full-dimension digital model of the vehicle body. The vehicle model information pertains to information of vehicle type, from which the dimension information of the above-described vehicle (e.g., a three-dimensional model of the body) may be directly and exclusively determined. As an example, the vehicle model may include a brand, model name, and model year of the vehicle. For example, for FAW-Volkswagen's Magotan 2018 automobile, its brand is FAW-Volkswagen, its model name is Magotan, and its model year is 2018. The dimension information (e.g., a three-dimensional model of the body) of the vehicle may be determined directly and exclusively according to the brand, model name and model year.

The motion information of the vehicle may include a position, speed, direction, and the like of the vehicle. Optionally, the motion information of the vehicle may also include an acceleration of the vehicle. The above-described motion information may be measured by any known sensor on the vehicle itself and/or any known external sensor. Optionally, the motion information of the vehicle may also include a destination of the vehicle and/or a current travel scheme of the vehicle.

The dimension information of the vehicle may be stored in the memory 10. Alternatively or additionally, the vehicle model information of the present vehicle as well as the correspondence between all known vehicle models information and the dimension information (e.g., a digital body model) of the vehicle may be stored in the memory 10. Thus, in the case where the data received by the vehicle includes the vehicle model information, the dimension information (e.g., a three-dimensional model of the body) of the vehicle may be obtained by the correspondence stored in the memory 10.

Optionally, digitized models of the transport facilities may also be stored in the memory 10. The digitized models of the transport facilities accurately reproduce information of the road as well as other transport facilities on the road, such as geographical coordinates of the road; layout details of various lanes, entrances/exits and junctions on the road; as well as geographic coordinates of other transport facilities such as roadbeds and obstacles in a digitized manner.

Optionally, the memory 10 may also store computer instructions for execution.

The processor 30 may include any type of calculation means, calculation circuit, or integrated circuit capable of executing a series of instructions stored in the memory. The processor may include any type of processor, such as a single core and/or multi-core central processing unit (CPU), a microprocessor, a digital signal processor, and the like. The processor may also include a memory to store data and/or algorithms to execute a series of instructions. The processor 30 may be associated with the memory 10 and with the communication module 20, and configured to generate instructions for controlling a motion of the vehicle. The processor 30 may be configured to perform the following method.

The processor 30 may obtain the digital body model of the present vehicle. The digital body model of the present vehicle may be stored in the memory 10, obtained from the dimension information of the present vehicle stored in the memory 10, or obtained from the vehicle model information of the present vehicle and the correspondence between the vehicle model information and the digital body model stored in the memory 10. The digital body model of the present vehicle may include a three-dimensional digital model of the vehicle body.

The processor 30 may generate a digitized body model of other vehicles according to the dimension information other vehicles within a certain range around the present vehicle. Wherein, the dimension information of other vehicles may come from the dimension information transmitted by other vehicles. Alternatively the processor 30 may generate said digitized body model of other vehicles according to the vehicle models information transmitted by other vehicles as well as the correspondence between the vehicle models information and the digital body model of the vehicle stored in the memory 10. The digital body models of said other vehicles may include three-dimensional digital models of the vehicle bodies.

The processor 30 may load digitized models of the transport facilities and load the digitized body model of the present vehicle and digitized body models of other vehicles on the digitized models of the transport facilities.

The processor 30 may make calculations to control a motion of the present vehicle according to the digitized body model of the present vehicle and the digitized body models of other vehicles within a certain range around the present vehicle loaded on the digitized models of the transport facilities and according to the motion information of said other vehicles and the motion information of the present vehicle. The control may be implemented by transmitting an instruction such as acceleration, deceleration, direction change, and braking to the present vehicle.

Since each vehicle on the road initiatively communicates its body information and motion information with other vehicles, the vehicles do not need to detect the conditions of the vehicles around in real time, thus avoiding substantial synthesis, processing and calculation of data detected in real time, thereby significantly reducing the amount of data transmission and the amount of calculation by a vehicle end processor.

Furthermore, since the data amount of all known vehicle models information is much less than the data amount of all vehicle IDs, compared with indirectly obtaining the body information of the vehicles by exchanging the vehicle ID information between vehicles, by directly obtaining the body information of the vehicles through exchanging the vehicle model information such as brands, model names and model years of the vehicles between vehicles, it is possible to significantly reduce the required data processing amount of the processor and significantly improve the calculation rate, and at the same time it is also possible to obtain an accurate three-dimension digital model of vehicle body.

Optionally, according to the obtained body information of the present vehicle and other vehicles, the simulated contours of the present vehicle and other vehicles may be projected on the digitized models of the transport at facilities. The processor 30 may determine whether the present vehicle is subject to a risk of collision (for example overlapping of the simulated contours) with other vehicles according to the motion information of the present vehicle and the motion information of other vehicles (e.g., a position, speed, direction, acceleration, and/or current travel scheme, and the like). If it is determined that there is no risk of collision, the processor 30 may control the present vehicle to maintain the current travel scheme. If it is determined that there is a risk of collision, the processor 30 may change the current travel scheme of the present vehicle M1 to prevent a collision. For example, the processor 30 may control the present vehicle M1 to maintain a predetermined distance from the preceding vehicle M3. The processor 30 may control the present vehicle M1 to avoid other vehicle M2 on the left side. The processor 30 may control the present vehicle M1 to stop when the preceding vehicle M3 in front stops and there are other vehicles M2 on the left side. The processor 30 may control the vehicle to change to a lane on the left side when the preceding vehicle M3 in front stops and there is no other vehicle on the left side.

Optionally, as described above, the motion information transmitted and received may include the current travel scheme. The current travel scheme may include information such as the positions, speeds, directions and the like of the vehicle at various moments within a period of time starting from the current moment. The processor 30 of the vehicle control device 1 of the present vehicle may determine whether other vehicles within a certain range around the present vehicle are traveling according to their current travel schemes. If the processor 30 determines that other vehicles are traveling according to their current travel schemes and there is no new vehicle joining within a certain range around the present vehicle, since there is no risk on collision at this time, the processor 30 may control the present vehicle to continue to travel according to the current travel scheme of the present vehicle. If the processor 30 determines that other vehicles are not traveling according to their current travel schemes or there is a new vehicle joining within a certain range around the present vehicle, the processor 30 recalculates to control the motion of the present vehicle. In this manner, within a period of time, the processor 30 of the present vehicle does not have to perform calculation in real time when there is no change in conditions within a certain range around the present vehicle, thereby the amount of calculation of the processor is reduced.

Optionally, determining whether other vehicles within a certain range around the present vehicle are traveling according to their current travel schemes may include: comparing real-time motion information such as position, speed, direction, and/or acceleration and the like from other vehicles received by the present vehicle in real time with theoretical motion information such as theoretical position, speed, direction and/or acceleration and the like obtained from the current travel schemes of other vehicles received by the present vehicle. If both of them are consistent, it is determined that other vehicles are traveling according to their current travel schemes. Otherwise, it is determined that other vehicles are not traveling according to their current travel schemes.

Optionally, as an alternative, determining whether other vehicles within a certain range around the present vehicle are traveling according to their current travel schemes may include that: when the vehicles are not traveling according to the current travel scheme or changing the current travel scheme, the vehicles transmit state change signals to other vehicles within a certain range around. If the present vehicle receives a state change signal, it is determined that other vehicles are not traveling according to their current travel schemes.

Optionally, in the present embodiment, a plurality of monitoring means may be mounted externally to the vehicle. The monitoring means may be mounted on both sides of the road or on the road at regular intervals. The distance may be 2 meters to 500 meters, and the distance may also be a value that is less than 2 meters or greater than 500 meters. The monitoring means may be configured to be capable of monitoring motion information such as position, speed and/or direction of the vehicles on the road, and capable of transmitting the monitored motion information to the communication module 20 of the respective vehicles. The monitoring means may for example include any known distance measuring sensor, speed sensor, coil type sensor and/or pressure sensor. The coil type sensor and the pressure sensor which may be mounted on the road, generate electrical and pressure signals when a vehicle passes, thereby helping to determine information such as the speed or position of the vehicle. In this way, the vehicle may also obtain motion information of the vehicle from the monitoring means outside the vehicle, thereby increasing the reliability and safety of the automatic driving system.

Second Embodiment

Figure 3:
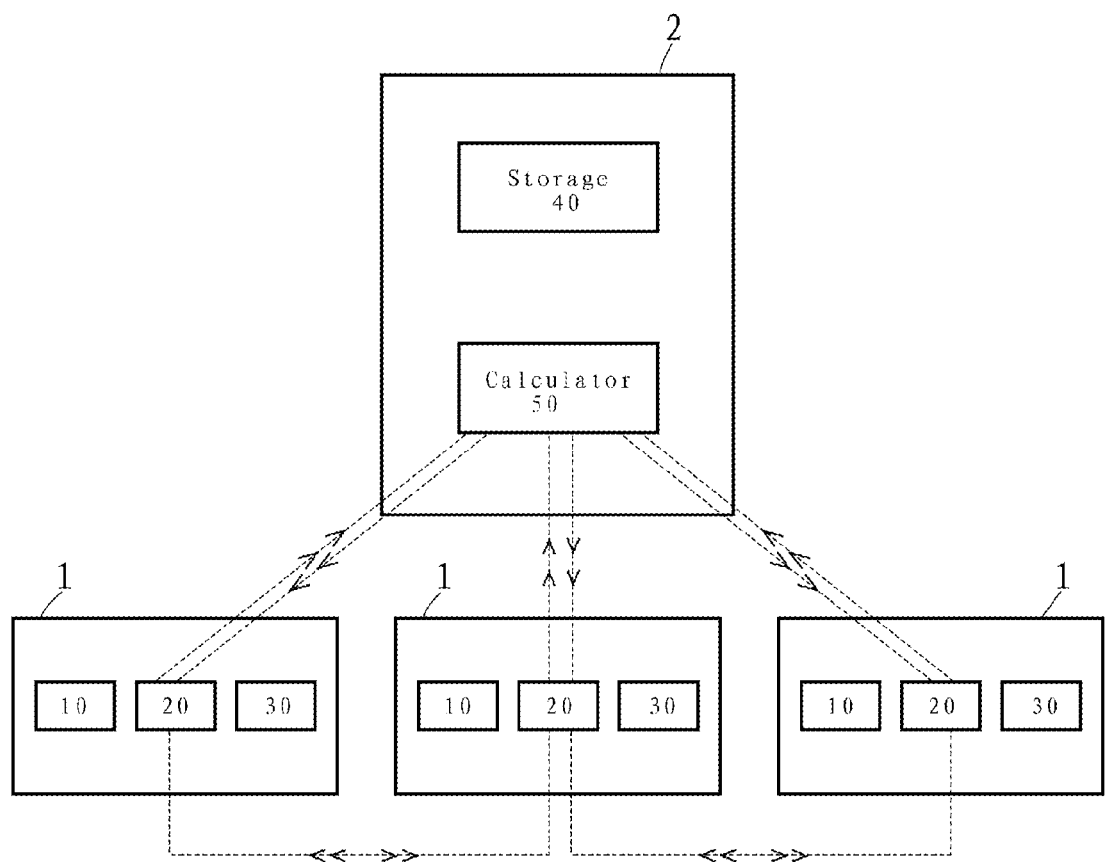
FIG. 3 shows a second embodiment according to the present disclosure.

FIG. 3 shows a schematic view of a vehicle control system according to a second embodiment of the present disclosure. The vehicle control system may include a server 2 located in a cloud external to the vehicle.

Optionally, the vehicle control system may include a vehicle control device 1 located on each vehicle on the road.

The vehicle control device 1 according to the present embodiment may comprise a memory 10, a communication module 20, and a processor 30 similar to those in the first embodiment. The memory 10 may store the dimension information of the present vehicle and/or the vehicle model of the present vehicle. However, in the case where the processing and calculation of data are both done on the server 2 in the cloud, the vehicle on the road may exclude the processor 30, that is to say, there may be no vehicle control device 1 on the vehicle.

The server 2 may include a storage 40 and a calculator 50.

The storage 40 may include a read only memory (ROM), a random access memory (RAM), a disk storage medium, an optical storage medium, a flash memory device, or any other volatile or nonvolatile storage device. The storage 40 may store digitized models of the transport facilities. Optionally, the storage 40 may store the correspondence between all known vehicle models and the dimension information of the vehicle. Optionally, the storage 40 may also store computer instructions for execution. The storage 40 may be physically and/or virtually divided into a plurality of storage units.

The calculator 50 may include any type of calculation means, calculation circuit, or integrated circuit capable of executing a series of instructions stored in the storage. The calculator 50 may include any type of processor, such as a single core and/or multi-core central processing unit (CPU), a microprocessor, a digital signal processor, and the like. The calculator 50 may further comprise a storage to store data and/or algorithms to execute a series of instructions. The calculator may be physically and/or virtually divided into a plurality of calculation units.

For each vehicle on the road, the communication module 20 may be configured to transmit the dimension information and/or the vehicle model information of the vehicle to the server 2 and to transmit the motion information of said vehicle to the server 2. The motion information may include a position, speed, direction, and destination of the vehicle. The motion information may also include other motion information as described in the first embodiment. The communication module 20 may also be configured to receive an instruction to control a motion of the vehicle from the server 2.

Preferably, the road may be a highway, an expressway or a road for automatic driving. The road may also be an ordinary road.

At the moment T0, for example at an initial moment, the server 2 may load the digitized models of the transport facilities stored in the storage 40. At the moment T0, the server 2 may generate the digitized model of each vehicle according to the received dimension information transmitted by each vehicle on the road, or the server 2 may call the digitized model of each vehicle according to the vehicle model information as well as the correspondence between the vehicle model information and the digital body model stored in the storage 40, and the server 2 may load the digitized model of each vehicle on the digitized models of the transport facilities. The calculator 50 of the server 2 may calculate a travel scheme for each vehicle starting from a moment T0 until a moment upon exiting the road according to the digitized body model of each vehicle loaded on the digitized models of the transport facilities and the motion information of each vehicle (including position, speed, direction, destination and the like) at the moment T0; and the travel scheme is transmitted to the respective vehicle so as to control a motion of the vehicle on the road. The travel scheme may include information such as positions, speeds, directions and the like of the vehicle at various moments starting from the moment T0 until the moment upon exiting the road.

In this manner, compared with the control based on the communication among vehicles in the first embodiment, in addition to the advantages brought by the vehicle initiatively notifying their state, there are further advantages, i.e., since the data processing and calculation are both done on the server in the cloud, the calculation and processing efficiencies as well as the processing capabilities are improved, and it is possible to coordinately optimize all the vehicles traveling on the road.

Optionally, the travel scheme of each vehicle starting from a moment T0 to a moment upon exiting the road is calculated with such constraint conditions that each vehicle on the road is not subject to collision during travel and each vehicle travels at its optimum speed. Wherein, the optimum speed may be a lower value in the design speed (or the highest speed limit) of the road and the highest speed of the vehicle. The optimum speed may also be a speed value lower than the lower value but enabling a highest traffic efficiency of the road. In this manner, it is possible to ensure that each vehicle travels on the road at the highest or optimum speed, thereby improving the road capacity.

The server 2 may determine if there is a new calculation demand. If the server 2 judges that there is a new calculation demand, the server 2 recalculates the travel scheme of each vehicle on the road starting from the current moment until the moment upon exiting the road and transmits the new travel scheme to the respective vehicles on the road. Otherwise, the server 2 may not perform recalculation.

Optionally, the server 2 determines that there is a new calculation demand when there is a new vehicle entering the road or any vehicle on the road which does not travel according to the travel scheme (for example, abnormal conditions and the like).

Optionally, when a new vehicle enters the road from an entrance of the road, the vehicle will transmit vehicle identity information (e.g., vehicle ID or similar information) to the server 2. If the server 2 receives new vehicle identity information, it is determined that there is a new vehicle entering the road.

Optionally, the server 2 receives actual motion information such as the position, speed, direction and/or acceleration and the like of the vehicles on the road in real time, and compares the actual motion information with the theoretical motion information obtained from the travel schemes of the respective vehicles. If both of them are inconsistent, it is determined that the vehicles are not travelling according to the travel schemes. Optionally, as an alternative, the vehicle on the road may transmit a state change signal to the server through the communication module 20 when the vehicle on the road is not traveling according to the current travel scheme or changing the current travel scheme, and the server determines that the vehicle is not traveling according to the current travel schemes when receiving the state change signal.

In this manner, the server may not have to perform high-intensity calculations in real time, thereby reducing the load on the server.

Optionally, each vehicle may transmit vehicle body information such as dimension information and/or vehicle model information of the vehicle as well as motion information such as the position, speed, direction, destination and the like of vehicle to the server through the communication module 20 before entering the entrance of the road. The server calculates whether to allow the vehicle to enter the road and/or the vehicle entry policies, according to the above-described vehicle body information and motion information of the vehicle before the entrance of the road as well as the travel information (for example digitized model of the vehicle or its travel scheme) of each vehicle located in the road, and transmit respective instructions to the respective vehicles. Optionally, detection areas may be provided within a certain range before each entrance of the road, and the server performs calculation according to the above-described vehicle body information and motion information of vehicle located within the detection areas as well as information of each vehicle located in the road. The vehicle entry policies include information such as the moment at which a vehicle enters the road, the initial speed, the direction, the lane, and/or the speed change policy. For example, if the server determines that the vehicle is not suitable for entering the road, the server will transmit to the vehicles an instruction of prohibit entry into the road. For example, if the server determines by calculation that the vehicle entering the road in current travel state may make the vehicles in the road unable to travel at the optimum speeds, the server will calculate entry policies for the vehicle so that the entry of the vehicle does not affect the travel of the current vehicles in the road at the optimum speeds, and transmits corresponding travel instruction to the vehicle according to the entry policies. In this way, by taking the information initiatively reported by the vehicles as the calculation object, the entrance conditions of the road to be controlled are optimized, thereby ensuring that the road to be controlled is always running under optimum conditions.

Optionally, the server 2 may divide the digitized models of the transport facilities into a plurality of sections or a plurality of sub-models and may individually distribute a storage unit and/or a calculation unit for each section or each sub-model. The "individually distribute" may refer to "individually distribute physically", "individually distribute virtual units", "individually distribute a fixed unit" or "individually distribute dynamically each time". In other words, the server may individually call respective sections or sub-models and individually perform calculation for the respective sections or sub-models using individual calculation units. Optionally, the server 2 may individually determine whether there is a new calculation demand for each section or sub-model in the manner described above. For example, if it is determined that a vehicle that newly enters the road or a vehicle that is not travelling according to the travel scheme appears in the section or sub-model, it is determined that the section or sub-model has a new calculation demand. At this time, it is possible to perform recalculation only for this section or sub-model or for adjacent sections or sub-models within a certain range around this section or sub-model. In this way, it is avoided that the server needs to recalculate the entire road every time, thereby greatly reducing the load on the server, and also facilitating the server to collectively distribute the calculation units for the sections or sub-models required to be calculated, thereby greatly improving the calculation speed.

Optionally, the information transmitted between the vehicle and the server can be converted into blockchain information, so that the information transmitted between the vehicle and the server is encrypted for transmission by a blockchain technique, thereby preventing the information from being tampered, and ensuring the safety of the system.

Optionally, in the present embodiment, a plurality of monitoring means may also be mounted externally to the vehicle. The monitoring means may be the same as the monitoring means as described in the first embodiment, and thus will not be repeated here. The monitoring means may be configured to transmit the monitored motion information of the vehicle to the vehicle and/or server.

Optionally, in the present embodiment, the communication module 20 may also be configured to transmit the dimension information and/or the vehicle model as well as the motion information of the present vehicle to other vehicles within a certain range around the present vehicle, and receive the dimension information and/or the vehicle models as well as the motion information of other vehicles from other vehicles within a certain range around the present vehicle, as described in the first embodiment. When the communication between the vehicles and the server fails or the user initiates a control mode based on the vehicle-to-vehicle communication as needed, the vehicle control system of the present embodiment may also adopt a manner as disclosed in the first embodiment, that is, control the motion of the present vehicle based on the information exchange between the present vehicle and other vehicles within a certain range certain range. Since this manner has been described in detail in the first embodiment, it will not be repeated here. In this manner, the control mode based on the vehicle-to-vehicle communication and the control mode based on the communication between the vehicles and the server are organically combined, thereby further improving the reliability of the system.

Third Embodiment

Figure 4:
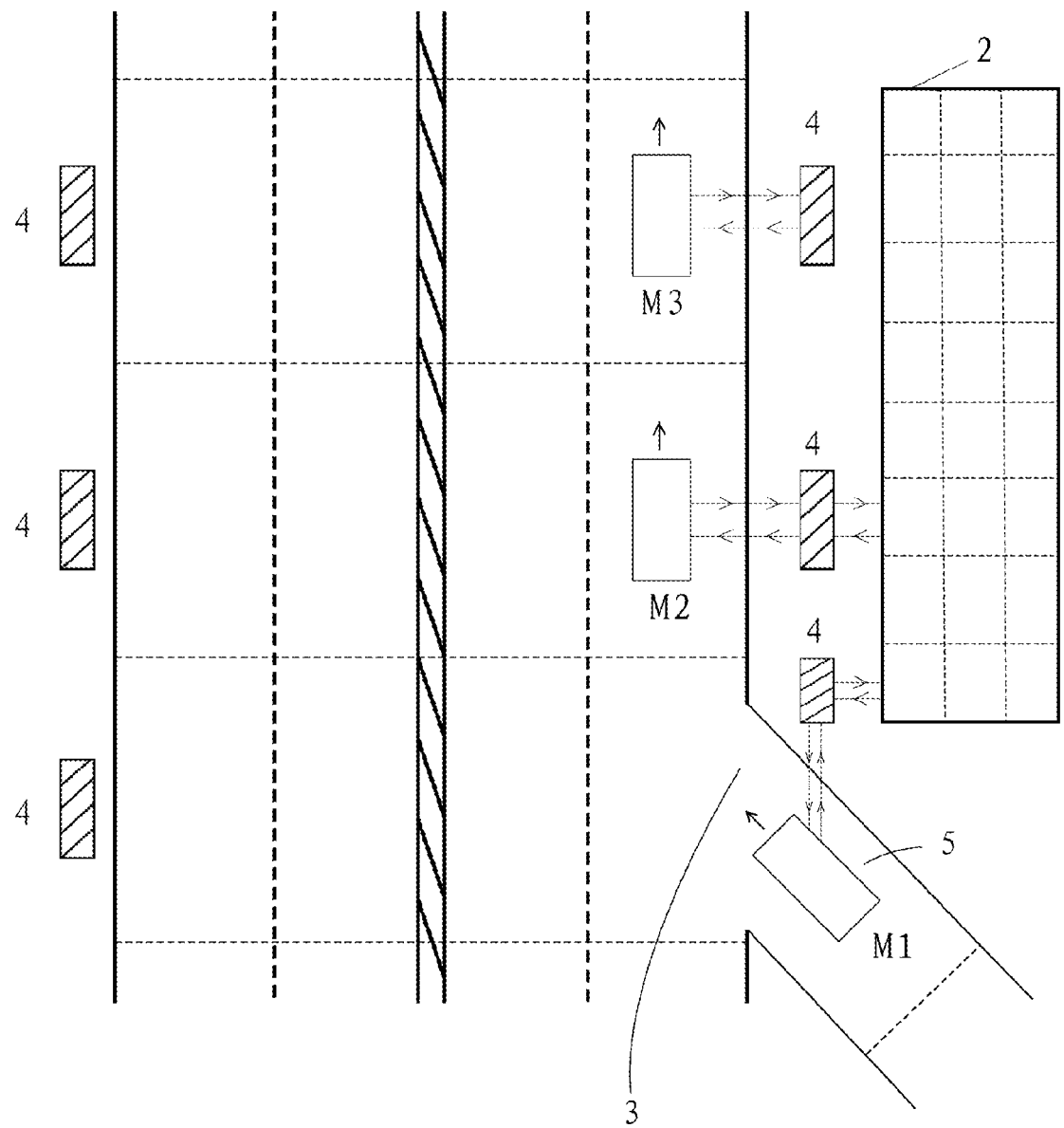
FIG. 4 shows a third embodiment according to the present disclosure.

FIG. 4 shows a third embodiment of the present disclosure. In the present embodiment, the description in the second embodiment is also applicable to the present embodiment unless otherwise specified. The same portions as those in the second embodiment will not be described in detail, and only the differences from the second embodiment in the present embodiment will be described below.

In the vehicle control system of the present embodiment, a plurality of relay means 4 may be provided. The relay means 4 may be disposed at the entrance 3 and/or in front of the entrance (for example in the detection areas 5) of the road. The relay means 4 may also be disposed to be spaced from each other at a predetermined distance. The relay means 4 may be disposed on both sides of a two-directional road. The relay means may also be buried under the lanes or suspended above the road.

The relay means may include wireless communication means. The wireless communication means may be a wireless transmission device that transmits and receives data based on a wireless communication protocol. The wireless communication module may be implemented in any wireless communication manner such as 2G/3G/4G/5G mobile communication, Bluetooth, infrared, Zigbee, WiFi, LPWAN, and the like. The wireless communication means may include a wireless transmitter and a wireless receiver. As an alternative, the wireless communication module means may include a wireless transceiver.

The relay means may be configured to be capable of receiving signals transmitted by the vehicles and capable of transmitting the received signals transmitted by the vehicles to the server. The relay means may also be configured to be capable of receiving signals transmitted by the server and capable of transmitting the received signals transmitted by the server to the vehicles.

Each relay means may be configured to be responsible for communication within its monitoring range. When the vehicles enter the monitoring range of the relay means, the communication module 20 of the vehicles may automatically perform bilateral information exchange with the relay means. The road length covered by the monitoring range may be 2 meters to 500 meters, for example, 2 meters, 5 meters, 10 meters, 50 meters, 100 meters, 200 meters, etc., and may also be a length of less than 2 meters or more than 500 meters, and the road width covered by the monitoring range may contain the total width of the road in the respective direction.

Optionally, the relay means located at the entrance 3 and/or in front of the entrance (e.g., in the detection areas 5) of the road may have an electronic permitting/prohibiting function. Optionally, if the server determines by calculation that the vehicle capacity in the road to be controlled is saturated so that the entry of a foreign vehicle may cause that the current vehicles in the road are unable to travel at their optimum speeds, the server may transmit a prohibiting signal to the relay means at the entrance and/or in front of the entrance (e.g. in the detection areas 5). Otherwise, the server may transmit a permitting signal to the relay means at the entrance and/or in front of the entrance (e.g. in the detection areas 5). The vehicles passing through the monitoring range of the relay means at the entrance and/or in front of the entrance (e.g., in the detection areas 5) may receive a permitting or prohibiting signal from the relay means, and thereby control the travel of the vehicles.

Optionally, the server 2 may individually distribute a storage unit and/or a calculation unit for each relay means and its monitoring range. The "individually distribute" may refer to "individually distribute physically", "individually distribute virtual units", "individually distribute a fixed unit" or "individually distribute dynamically each time". The digitized models of the transport facilities may be divided into a plurality of sections or a plurality of sub-models as those in the second embodiment. Each relay means and its monitoring range corresponds to a respective section or sub-model. In other words, the server may individually call individual section or sub-model (i.e. relay means and its monitoring range) and individually perform calculation for that section or sub-model. In this way, each relay means will be rigidly connected with a particular calculation unit of the server with respect to information transmission. Thus, for a particular relay means and a particular geographic area monitored by the same, calculation may be performed with a particular calculation unit, which may facilitate the distribution and distributed layout of the calculation units of the server.

Furthermore, optionally, for each relay means and its monitoring range, the relay means may also be configured to monitor whether new calculation demand is generated in the present area. Optionally, if the relay means monitors signals (e.g., new vehicle identities or ID signals) from vehicles newly entering the road or if the relay means detects a state change signal transmitted from a vehicle within the monitoring range (i.e. the vehicles no longer travel according to the travel schemes), the relay means determines that new calculation demand is generated in the present area. Otherwise, if the relay means does not monitor a signal transmitted from the vehicle newly entering the road and does not detect the state change signal transmitted from the vehicle within the monitoring range, the relay means determines that new calculation demand is not generated in the present area. If the relay means determines that new computing demand is generated in the present area, the relay means will transmit the received information transmitted by the vehicles of the present area to the server, thereby wake the server to perform calculation. In addition, if the relay means determines that new computing demand is generated in the present area, the relay means may also inform the neighboring relay means within a certain range around said relay means. If the relay means determines that no new calculation demand is generated in the present area, and as an alternative condition, the relay means does not receive notifications transmitted from the neighboring relay means within a certain range of said relay means as well, it is indicated that recalculation is not required in the present area, so that the relay means may not transmit the received information transmitted by the vehicles in the present area to the server, so that the corresponding unit of the server are in an asleep state. In this manner, the data is decentralized processed and the processing and calculation loads of the server are reduced to a minimum.

Optionally, the relay means may also be configured to have an assisted positioning function to make the position determination of the vehicle faster and more accurate, so as to solve the problems that the GPS positioning speed is slow and it is difficult to achieve an accuracy on lane level. For example, assisted positioning may employ base station positioning, WIFI assisted positioning, and/or AGPS assisted positioning.

Optionally, in the present embodiment, the relay means may also be integrated with monitoring sensors. The monitoring sensors are configured to be capable of monitoring motion information such as position, speed and/or direction of the vehicles on the road, and capable of transmitting the monitored motion information to the communication module 20 of the respective vehicles and/or the server. The monitoring sensors may for example include any known distance measuring sensor, speed sensor, coil type sensor and/or pressure sensor. The coil type sensor and the pressure sensor which may be mounted on the road, generate electrical signal and pressure signal when a vehicle passes, thereby helping to determine information such as the speed or position of the vehicle. In this way, the vehicle may also obtain motion information of the vehicle from the monitoring means outside the vehicle, thereby increasing the reliability and safety of the automatic driving system.

Other Embodiments

The present disclosure also relates to a computer readable storage medium on which a computer program is stored, wherein the computer program is executed by a processor to implement the methods described in the previous various embodiments of the present disclosure.

The embodiment of the present invention may also be implemented by a method in which a software (program) for performing the functions of the above-described embodiments is provided to a system or a device through a network or various storage media, and the computer, the central processing unit (CPU), or the microprocessing unit (MPU) of the system or device reads and execute the program.

INDUSTRIAL PRACTICAL APPLICABILITY

The present disclosure may be applied to control a motion of the vehicle, and thus has industrial practical applicability.

Although only particular embodiments of the present disclosure are illustrated and described here, multiple amended solutions or modified solutions can be contemplated by those skilled in the art. Therefore, it is to be understood that the appended claims are intended to cover all the amended solutions or modified solutions within the range of the actual spirit of the present disclosure.

What is claimed is:

1. A vehicle control device, comprising:
a memory;
a communication module, configured to transmit data of the present vehicle to other vehicles within a first range around a present vehicle and to receive data of the other vehicles within the first range around the present vehicle, wherein the data of the present vehicle includes motion information of the present vehicle as well as at least one of dimension information of the present vehicle and vehicle model information of the present vehicle, and wherein the data of the other vehicles includes motion information of the other vehicles as well as at least one of dimension information of the other vehicles and vehicle model information of the other vehicles; and
a processor, configured to:
load digitized models of transport facilities;
generate a digitized model of the present vehicle containing the dimension information and motion information of the present vehicle according to the dimension information and motion information of the present vehicle, wherein the dimension information of the present vehicle comes from the dimension information of the present vehicle stored in the memory of the present vehicle or is obtained from the vehicle model information of the present vehicle;
generate digitized models of the other vehicles containing the dimension information and motion information of the other vehicles according to the dimension information and motion information of the other vehicles, wherein the dimension information of the other vehicles comes from the dimension information of the other vehicles received by the communication module or is obtained from the vehicle model information of the other vehicles received by the communication module;
load the digitized model of the present vehicle and the digitized models of the other vehicles on the digitized models of the transport facilities;
make a calculation according to the digitized model of the present vehicle and the digitized models of the other vehicles loaded on the digitized models of the transport facilities; and
transmit an instruction to the present vehicle by a server based on the calculation to control a motion of the present vehicle according to the digitized model of the present vehicle and the digitized models of the other vehicles loaded on the digitized models of the transport facilities.

2. A vehicle, comprising the vehicle control device according to claim 1.

3. A vehicle control method, comprising:
transmitting data of the present vehicle to other vehicles within a first range around the present vehicle and receiving data of the other vehicles within the first range around the present vehicle, wherein the data of the present vehicle includes motion information of the present vehicle as well as at least one of dimension information of the present vehicle and vehicle model information of the present vehicle, and wherein the data of the other vehicles includes motion information of the other vehicles as well as at least one of dimension information of the other vehicles and vehicle model information of the other vehicles;
loading digitized models of transport facilities;
generating a digitized model of the present vehicle containing the dimension information and motion information of the present vehicle according to the dimension information and motion information of the present vehicle, wherein the dimension information of the present vehicle comes from the dimension information of the present vehicle in the data of the present vehicle or is obtained from the vehicle model information of the present vehicle;
generating digitized models of the other vehicles containing the dimension information and motion information of the other vehicles according to the dimension information and motion information of the other vehicles, wherein the dimension information of the other vehicles comes from the dimension information of the other vehicles received by the present vehicle or is obtained from the vehicle model information of the other vehicles received by the present vehicle;
loading the digitized model of the present vehicle and the digitized models of the other vehicles on the digitized models of the transport facilities;
making a calculation according to the digitized model of the present vehicle and the digitized models of the other vehicles loaded on the digitized models of the transport facilities; and
transmitting an instruction to the present vehicle by a server based on the calculation to control a motion of the present vehicle.

4. A computer readable storage medium, comprising a computer program, wherein the computer program is used for performing the method of claim 3.

5. A vehicle control system, comprising:
a server, wherein the server is disposed external to the vehicle,
wherein the server is configured to receive motion information of the vehicle as well as at least one of dimension information and vehicle model information of the vehicle transmitted by each vehicle traveling on road, and
wherein the server is further configured to:
load digitized models of transport facilities;
generate digitized models of each vehicle containing the dimension information of the vehicle and the motion information of the vehicle according to the dimension information of the vehicle and the motion information of the vehicle, wherein the dimension information of the vehicle comes from the dimension information of the vehicle transmitted by the vehicle or is obtained from the vehicle model information transmitted by the vehicle;
load a digitized model of each vehicle on digitized models of transport facilities;
calculate a travel scheme for each vehicle starting from a current moment until a moment upon exiting the road according to the digitized model of each vehicle loaded on the digitized models of the transport facilities; and
transmit an instruction to each vehicle based on the travel scheme to control a motion of the vehicle,
wherein the server is further configured to recalculate the travel scheme for each vehicle only when it is determined that there is a new calculation demand, and
wherein the server is configured to determine that there is a new calculation demand when receiving information transmitted by a vehicle newly entering the road or when determining that there is a vehicle on the road which is not travelling according to the travel scheme.

6. The vehicle control system according to claim 5, further comprising a communication module configured to transmit data of the present vehicle to other vehicles within a first range around the present vehicle and to receive data of the other vehicles within the first range around the present vehicle,
- wherein the data of the present vehicle includes motion information of the present vehicle as well as at least one of dimension information of the present vehicle and vehicle model information of the present vehicle, and
- wherein the data of the other vehicles includes motion information of the other vehicles as well as at least one of dimension information of the other vehicles and vehicle model information of the other vehicles.

7. The vehicle control system according to claim 5,
- wherein the vehicle control system further comprises one or more relay means, and
- wherein communication between the vehicle and the server is performed via the relay means, which is configured to monitor a predetermined monitoring range and to receive information transmitted by the vehicle when the vehicle enters and/or is within its monitoring range.

8. The vehicle control system according to claim 7,
- wherein the relay means is disposed at a road entrance and/or before a road entrance, and
- wherein the relay means is configured to transmit a permitting or prohibiting instruction to a vehicle ready to enter the road and/or to determine that a new calculation demand is generated within a monitoring range of the relay means when detecting a signal transmitted by a vehicle newly entering the road or when detecting a state change signal transmitted by a vehicle within its monitoring range.

9. The vehicle control system according to claim 5,
- wherein the vehicle control system further comprises a vehicle control device located on each vehicle, the vehicle control device comprising:
  - a memory;
  - a communication module, configured to transmit data of the present vehicle to other vehicles within a first range around the present vehicle and to receive data of the other vehicles within the first range around the present vehicle, wherein the data of the present vehicle includes motion information of the present vehicle as well as at least one of dimension information of the present vehicle and vehicle model information of the present vehicle, and wherein the data of the other vehicles includes motion information of the other vehicles as well as at least one of dimension information of the other vehicles and vehicle model information of the other vehicles; and
  - a processor, configured to:
    - load digitized models of transport facilities;
    - generate a digitized model of the present vehicle containing the dimension information and motion information of the present vehicle according to the dimension information and motion information of the present vehicle, wherein the dimension information of the present vehicle comes from the dimension information of the present vehicle stored in the memory of the present vehicle or is obtained from the vehicle model information of the present vehicle;
    - generate digitized models of the other vehicles containing the dimension information and motion information of the other vehicles according to the dimension information and motion information of the other vehicles, wherein the dimension information of the other vehicles comes from the dimension information of the other vehicles received by the communication module or is obtained from the vehicle model information of the other vehicles received by the communication module;
    - load the digitized model of the present vehicle and the digitized models of the other vehicles on the digitized models of the transport facilities;
    - control a motion of the present vehicle according to the digitized model of the present vehicle and the digitized models of the other vehicles loaded on the digitized models of the transport facilities; and
    - control a motion of the present vehicle according to data of the other vehicles within the first range around the present vehicle received by the vehicle control device when communication between the vehicle and the server fails.

10. A method for a vehicle control system, comprising:
- receiving, transmitted by each vehicle traveling on road, motion information of the vehicle as well as at least one of dimension information and vehicle model information of the vehicle by a server disposed external to the vehicle;
- loading digitized models of transport facilities by a server;
- generating digitized models of each vehicle containing the dimension information of the vehicle and the motion information of the vehicle by the server according to the dimension information of the vehicle and the motion information of the vehicle, wherein the dimension information of the vehicle comes from the dimension information of the vehicle transmitted by the vehicle or is obtained from the vehicle model information transmitted by the vehicle;
- loading a digitized model of each vehicle on digitized models of transport facilities by the server;
- calculating a travel scheme for each vehicle starting from a current moment until a moment upon exiting the road by the server according to the digitized model of each vehicle loaded on the digitized models of the transport facilities; and
- transmitting an instruction to each vehicle by the server based on the travel scheme to control a motion of the vehicle.

11. The method according to claim 10, wherein information of the vehicle is transmitted to the server by a communication module on the vehicle, and the instruction to control the motion of the vehicle is received from the server by the communication module on the vehicle.

12. The method according to claim 10, wherein the method further comprises:
- transmitting data of the present vehicle to other vehicles within a first range around the present vehicle, and
- receiving data of the other vehicles within the first range around the present vehicle by the communication module,
- wherein the data of the present vehicle includes motion information of the present vehicle as well as at least one of dimension information of the present vehicle and vehicle model information of the present vehicle, and
- wherein the data of the other vehicles includes motion information of the other vehicles as well as at least one of dimension information of the other vehicles and vehicle model information of the other vehicles.

13. The method according to claim 12, further comprising controlling the motion of the present vehicle according to the data of the other vehicles within the first range around the present vehicle received by the present vehicle if communication between the vehicle and the server fails.

14. The method according to claim 10, further comprising:
   monitoring motion information of the vehicle, and
   transmitting the motion information to the vehicle and/or the server by one or more monitoring means disposed external to the vehicle.

15. A computer readable storage medium, comprising a computer program, wherein the computer program is used for performing the method according to claim 10.

\* \* \* \* \*